United States Patent [19]

Caldwell

[11] Patent Number: 5,166,946
[45] Date of Patent: Nov. 24, 1992

[54] APPARATUS FOR AND METHOD OF CONTROLLING THE EMISSION OF A LASER

[75] Inventor: Paul J. Caldwell, Baltimore, Md.

[73] Assignee: Martin Marietta Corporation, Bethesda, Md.

[21] Appl. No.: 596,884

[22] Filed: Oct. 12, 1990

[51] Int. Cl.[5] ............................................. H01S 3/19
[52] U.S. Cl. ...................................... 372/50; 372/8; 372/26; 372/46
[58] Field of Search ................... 372/50, 45, 46, 8, 26

[56] References Cited

U.S. PATENT DOCUMENTS

| 3,431,437 | 3/1969 | Kosonocky | 372/8 |
| 4,751,707 | 6/1988 | Krebs et al. | 372/8 |
| 4,825,442 | 4/1989 | Fitz | 372/8 |

OTHER PUBLICATIONS

Kawaji et al., "Injection Laser Half Adder", Proceedings of the IEEE, Oct. 1967, pp. 1766-1767.
C. E. Kelly, "Solid-State Exclusive Or Device", IBM Technical Disclosure Bulletin, vol. 7, No. 11, Apr. 1965.
John L. Fitz, "Optical Logic via Optically Controlled Lasers", App. Physics Projects report written for class at Johns Hopkins University, Jul. 29, 1988.
D. R. Scifres, R. D. Burnham, C. Lindstrom, W. Streifer, & T. L. Paoli, "Phase-Locked (GaAl) As Laser Emitting 1 5W cw per Mirror", Appl. Phys. Lett., vol. 42, No. 8, pp. 645-647, Jan. 1983.
D. R. Scifres, C. Lindstrom, R. D. Burnham, W. Streifer, & T. L. Paoli, "Phase-Locked (GaAl) As Laser Didoe Emitting 2.6W cw from a Single Mirror", Elec. Lett., vol. 19, No. 5, pp. 169-171, Mar. 1983.
G. L. Harnagel, P. S. Cross, D. R. Scifres, D. F. Welch, C. R. Lennon, & D. P. Worland, "High-Power Quasi--cw Monolithic Laser Diode Linear Arrays", Appl. Phys. Lett., vol. 19, No. 21, pp. 1418-1419 Nov. 1986.
R. C. Goodfellow, A. C. Carter, G. J. Rees, & R. Davis, "Radiance Saturation in Small-Area GaInAsP/InP and GaAlAs/GaAs LED's", IEE Trans. on Elec. Dev. ED-28(4), pp. 365-371, 1981.
K. Y. Lau & A. Yariv, "Ultra-High Speed Semiconductor Lasers", IEEE J. Quan. Elec. QE-21, pp. 121-138, Feb. 1985.
M. K. Chun, L. Goldberg & J. F. Weller, "Injection-Beam Parameter Optimization of an Injection-Locked Diode-Laser Array", Opt. Lett., vol. 14, No. 5, pp. 272-274, Mar. 1989.
Alan B. Fowler, "Quenching of Gallium-Arsenide Injection Lasers", Appl. Phys. Lett., vol. 3, No. 1, pp. 1-3, Jul. 1963.
G. J. Lasher & A. B. Fowler, "Mutually Quenched Injection Lasers as Bistable Devices", IBM J. of Res. & Dev., vol. 8, No. 4, pp. 471-475, Sep. 1964.
J. L. Fitz, W. T. Beard, C. W. Lowry, S. Ovadia & C. H. Lee, "5.0-GHz Modulation Rate of Light by Light in GaAs Laser Diode", presented at CLEO, Jun. 13, 1986, paper FH2.
W. J. Grande & C. L. Tang, "Semiconductor Laser Logic Gate Suitable for Monolithic Integration", Appl. Phys. Lett., vol. 51, No. 22, pp. 1780-1782, Jul. 1987.

Primary Examiner—James W. Davie
Attorney, Agent, or Firm—James B. Eisel; Alan G. Towner; Gay Chin

[57] ABSTRACT

A method of and apparatus for high speed modulation of a laser by controlling stimulated emission in the direction transverse main output. Because gain in either direction is derived from the same pool of excited carriers, lasing in the transverse direction depletes gain available in the longitudinal direction. The control of the forward output is achieved using either (1) transverse transmission regions depending on the applied bias or (2) transverse absorbing regions.

25 Claims, 10 Drawing Sheets

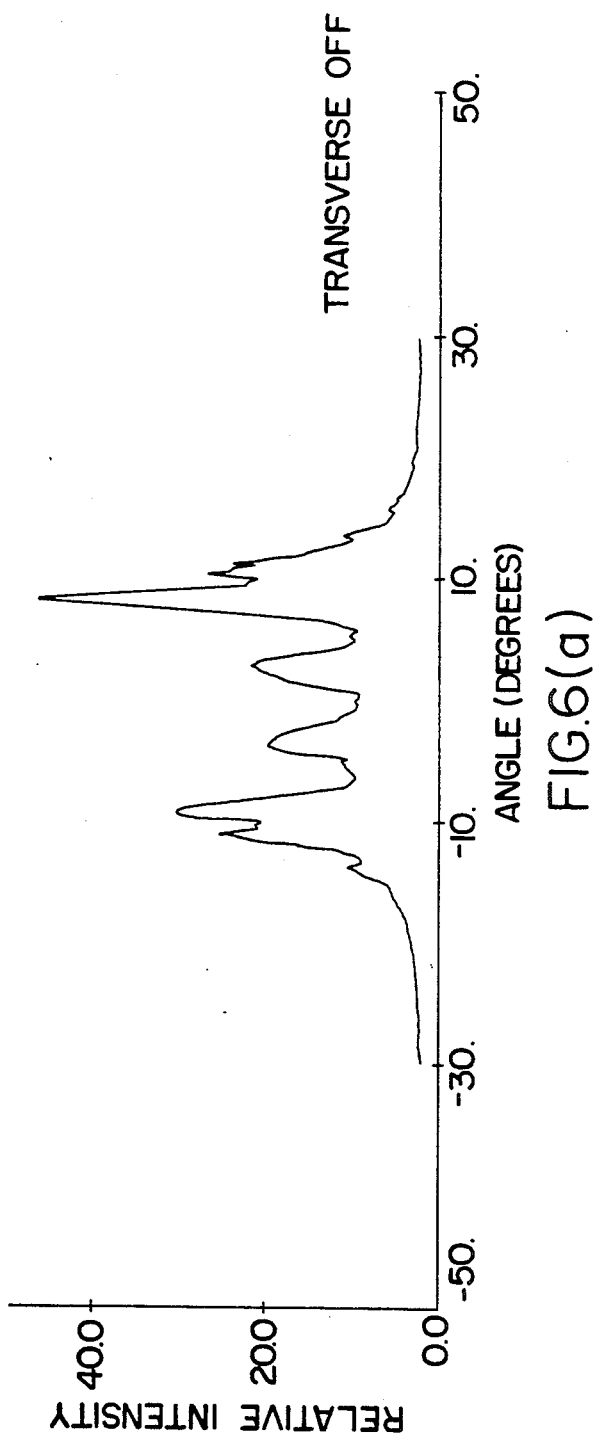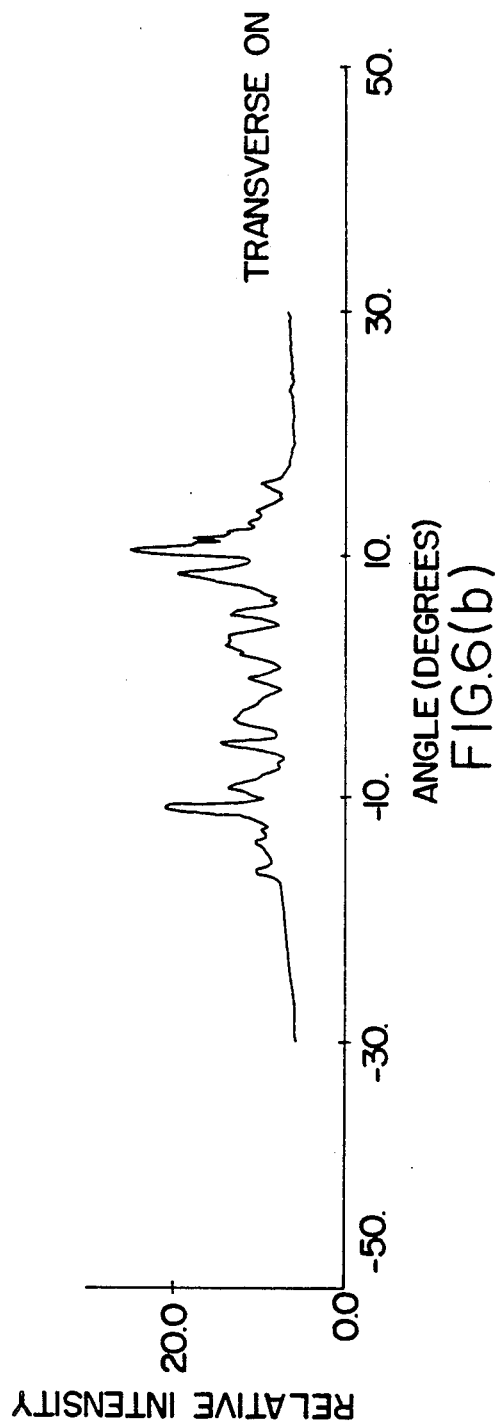

APPARATUS FOR AND METHOD OF CONTROLLING THE EMISSION OF A LASER

BACKGROUND OF THE INVENTION

1. Field of the Invention

The invention relates to the control of emission from a laser. It is potentially useful in many fields including use as transducers in communication systems, laser oscillators, optical transistors, and optical monostable or bi-stable devices.

2. Description of Related Art

The use of lasers in many applications has recently increased dramatically. For example, the use of semiconductor laser diodes for optical communication systems has increased over the past two decades due primarily to their small size, high efficiency, and susceptibility to high speed modulation. See K.Y. Lau and A. Yariv, "Ultra-High Speed Semiconductor Lasers", *IEEE J. Quan. Elec.* QE-21, pages 121-138, Feb. 1985. Currently, they are used in fiber-optic systems, optoelectronic integrated circuits (OEICs), and free-space laser communications.

In the communications field, the need for transmission of data at increasingly higher data rates has driven the development of high-speed optical communication systems. Because of their small size, high efficiency, and fast response time, semiconductor lasers have come to be used extensively as a source of light in ground-based optical communication systems.

In satellite systems, the use of optical transceivers employing laser diodes is even more attractive. In addition to the potential of high data rates, these systems are compact, long lived, and are relatively insensitive to external interference.

Future systems designated for higher data rates and greater range will require higher power lasers with tight control on the beam quality (i.e., a highly coherent, nearly diffraction-limited beam). Increasing the power output of phased-array laser diodes will require an increase in the number of stripes in the array. Unfortunately, the addition of more stripes in a laser array increases the current necessary to operate the laser as well as increasing the device capacitance.

At high data rates (into the multi-gigahertz range) it becomes extremely difficult to vary the laser output. The most common method of modulating the output of these lasers (for low to moderate frequencies) is by direct current modulation. However, as modulation rates increase (past a few gigahertz) and operating currents increase (e.g., in phased array lasers), problems associated with the dynamics of current modulation of the laser have necessitated the development of other methods. These methods usually include guiding the emitted light through external waveguide(s) in which the optical properties of the waveguide material may be varied by application of a bias. This variation consists of a change in the optical absorption and/or change in the optical index of refraction.

Unfortunately, while acceptable in some applications, these methods have not (to date) proven useful for modulating high-power phased-array diode lasers. This is due primarily to the inherent optical absorption (even in the "clear" or "bleached" state) and distortion experienced by a wavefront passing through waveguides fabricated with currently available techniques and materials.

One method of modulating high power phased arrays is to use the array as an amplifier for a smaller, well-behaved master oscillator (known as the MOPA or master oscillator-power amplifier configuration). See M.K. Chun, L. Goldberg and J.F. Weller, "Injection-Beam Parameter Optimization of an Injection-Locked Diode-Laser Array", *Opt. Lett.*, Vol. 14, No. 5, pages 272-274, March 1989. While this method has shown promising results, instabilities in the beam quality and wavelength ("chirp") of the master oscillator at high modulation frequencies may ultimately limit the usefulness of this method of modulation.

Quenching of the output from a single laser by injection of light from another completely separate laser has been observed in the past for GaAs diode lasers and other systems. See, U.S. Pat. No. 3,431,437 to W.F. Kosonocky, entitled "Optical System for Performing Digital Logic", issued Mar. 4, 1969; Alan B. Fowler, "Quenching of Gallium-Arsenide Injection Lasers", *Appl. Phys. Lett.*, Vol. 3, No. 1, pages 1-3, July 1963; G.J. Lasher and A.B. Fowler, "Mutually Quenched Injection Lasers as Bistable Devices", *IBM J. of Res. and Dev.*, Vol 8, No. 4, pages 471-475, Sept. 1964; J.L. Fitz, W.T. Beard, C.W. Lowry, S. Ovadia and C.H. Lee, "5.0-GHz Modulation Rate of Light by Light in GaAs Laser Diode", presented at CLEO, Jun. 13, 1986, paper FH2; W.J. Grande and C.L. Tang, "Semiconductor Laser Logic Gate Suitable for Monolithic Integration", *Appl. Phys. Lett.*, Vol. 51, No. 22, pages 1780-1782, July 1987; John L. Fitz, "Optical Logic via Optically Controlled Lasers", Applied Physics Projects report written for a class at Johns Hopkins University, Jul. 9, 1988.

It is also known that there is a certain amount of transverse stimulated emission inherently present within a linear phased-array laser. See, D.R. Scifres, R.D. Burnham, C. Lindstrom, W. Streifer, and T.L. Paoli, "Phase-Locked (GaAl)As Laser Emitting 1.5 W cw per Mirror", *Appl. Phys. Lett.*, Vol. 42, No. 8, pages 645-647, Jan. 1983; D.R. Scifres, C. Lindstrom, R.D. Burnham, W. Streifer, and T.L. Paoli, "Phase-Locked (GaAl)As Laser Diode Emitting 2.6 W cw from a Single Mirror", *Elec. Lett.*, Vol. 19, No. 5, pages 169-171, March 1983; G.L. Harnagel, P.S. Cross, D.R. Scifres, D.F. Welch, C.R. Lennon, and D.P. Worland, "High-Power Quasi-cw Monolithic Laser Diode Linear Arrays", *Appl. Phys. Lett.*, Vol. 49, No. 21, pages 1418-19, Nov. 1986; R.C. Goodfellow, A.C. Carter, G.J. Rees, and R. Davis, "Radiance Saturation in Small-Area GaInAsP/InP and GaAlAs/GaAs LED's, *IEEE Trans. on Elec. Dev.* ED-28(4), pages 365-371, 1981.

SUMMARY OF THE INVENTION

There thus remains a need for an effective method for high-speed modulation of laser output. This need is met in the present invention by controlling stimulated emission in a transverse direction. Because gain in either direction is derived from the same pool of excited carriers, lasing in the transverse direction depletes gain available to the forward direction. Control of the output of the phased array is achieved using regions of the device biased in such a manner as to 1) stimulate or 2) inhibit transverse lasing.

With proper design and bias of an array, the device could stably lase in either direction—transverse or forward—with only small impulses to the transverse contacts needed to make the device switch to lasing in the other direction. This can be viewed as analogous to a laser "hopping" between two allowed modes of operation and thus the action can occur as fast as a few photon cavity lifetimes, compared to the slower action of normal current injection which requires several carrier lifetimes.

Modulating the array amplitude and/or phase relationship between stripes by controlling transverse stimulated emission within the array has the advantages of negating the need to swing large currents to modulate the array, reducing the capacitance of the part of the array which must be modulated, negating optical field-electrical field interactions (by holding carrier injection and photon flux constant within the array), negating wavelength "chirping" during modulation (since the array would be operated under constant current), thermally and optically stabilizing the array (since it is operated in a cw mode), and being monolithically integratable on a single chip with existing technology.

This same technique also finds application in a high speed analog or digital optical transistor where the transverse control of lasing is the analog of controlling a base current while the longitudinal output is the analog of the collector current. With an array in which each stripe coupled to an optical waveguide, this device would have a fanout equal to the number of stripes in the array.

The technique is also useful to create either a monostable or a bi-stable device. With enough stripes in an array, there exists sufficient gain in either the forward or transverse direction to support lasing. In this case, a bias pulse of the proper polarity applied to the transverse contact would be all that would be needed to switch the device between forward lasing and transverse lasing.

The technique also lends itself to the design of a hybrid electro-optical oscillator. By placing a beam splitter in the output laser path and reflecting a partial beam onto a photodetector, an electrical signal proportional to the strength of the output beam is generated by the photodetector. This electrical signal can be fed back to the transverse contact power supply to thereby vary the bias on the transverse contacts. A variation of the transverse bias varies the amount of transverse lasing and thereby the amount of forward lasing, in accordance with the fed back signal, making the system a hybrid electro-optic oscillator.

The invention is also useful in modulating the optical coupling conditions between stripes in the phased array. Phase coupling of stripes in an array is dependent on the gain profile between the stripes. Transverse lasing can alter that gain profile and thus alter the phase coupling. If a phased array laser is operating in such a manner as to emit a nearly diffraction-limited beam, transverse biasing can change the phase relationship of the individual stripes such that the emitted beam is no longer diffraction limited. To a distant receiver (e.g., a satellite), causing the beam to be spread over a large angular cross section reduces the total amount of energy which falls on the receiver's detector. This would have the same effect as simply modulating the intensity of the beam.

BRIEF DESCRIPTION OF THE DRAWINGS

FIGS. 6(a) and 6(b) are graphs showing the effect of a transverse pulse on the intensity of a far field beam.

DETAILED DESCRIPTION OF THE PRESENTLY PREFERRED EMBODIMENTS

For the sake of explanation, the invention will be described below in terms of a concrete example, specifically, a semiconductor laser array. It will be appreciated, however, by one of ordinary skill in the art that the invention can be embodied in other forms as well. For example, an array may or may not be used. Also, the laser may be made not only from semiconductor materials such as gallium arsenide (GaAs), indium arsenide (InAs), and others of the same type, but also of nearly any other kind of lasing media, such as ruby, YAG or other solid lasing media, helium-neon or other gas lasing mediums, or liquid lasing media.

Figure 1A:
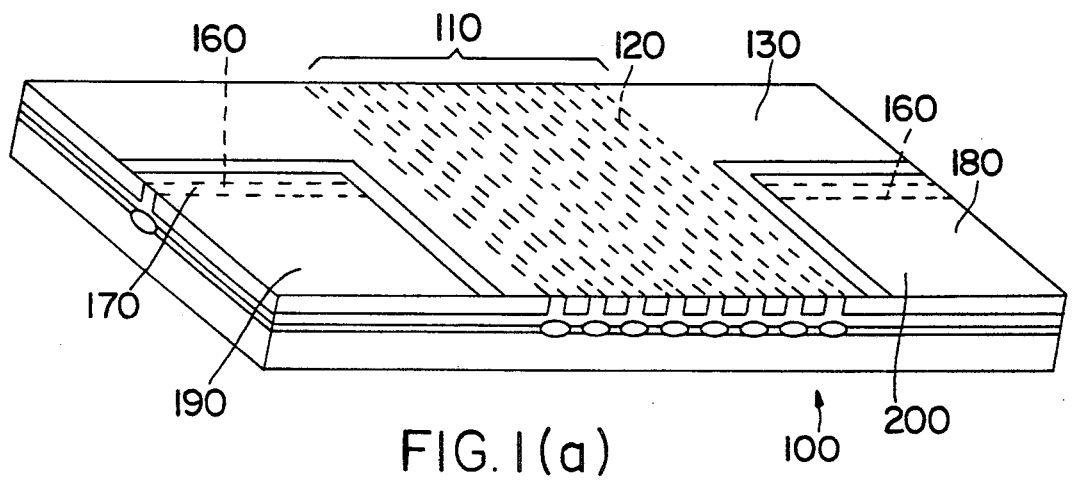
FIGS. 1(a) and 1(b) are a pseudo-perspective diagram and top plan diagram, respectively, of a first presently preferred embodiment of the invention.

With this in mind, FIG. 1(a) shows a presently preferred embodiment of semiconductor laser array according to the invention. The device, generally designated by the numeral 100, is roughly configured the same as a known multi-stripe linear array laser diode. For example, it has a longitudinal array 110 of stripes 120 (in phantom) contacting a common contact 130.

Figure 1B:
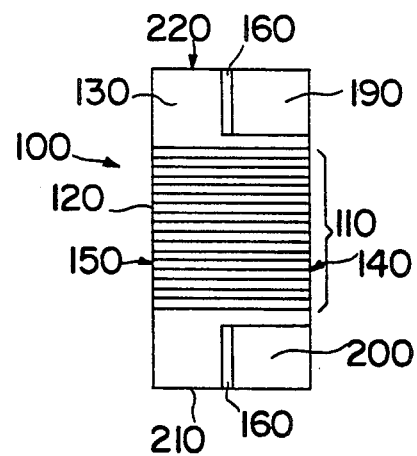

One end of the array 110 is provided with a first longitudinal end mirror 140 and the other end is provided with a second longitudinal end mirror 150 (FIG. 1(b)).

In addition to these conventional features, the device 100 also includes a transverse stripe 160 made up of a first transverse region 170 and a second transverse region 180. The first transverse region 170 and the second transverse region 180 are aligned with one another and contacted by a first transverse contact 190 and a second transverse contact 200, respectively. In addition, the transverse stripe 160 is bounded at each end by a first transverse mirror 210 and a second transverse mirror 220, respectively. As explained in more detail below, these additional features allow optical transmission (forward bias) or optical absorption (zero or reverse bias) transverse to the linear array portion 110 of the device 100.

It should be noted that as used here and in the claims, the term "transverse" is intended to encompass arrangements in which the elements (or linear extensions of elements) cross, regardless of the angle, and so is not limited to arrangements in which the stripes cross at right angles. It should also be noted that the device 100 does not necessarily require a longitudinal laser array and one transverse array. The longitudinal laser may be one or a plurality of stripes, and the transverse laser be one or a plurality of stripes, depending on the application. The configuration shown in FIG. 1(a) is exemplary, and presently preferred.

It should also be noted that the common contact 130 of the longitudinal array 110 may be divided into a plurality of contacts $130_1$–$130_n$, which may be independently addressable.

In operation, the multi-stripe longitudinal array 110 formed by the array stripes 120 is operated in a fashion similar to any other multi-stripe array laser in pulsed or continuous-wave (cw) mode. A forward bias is applied to the common array contact 130 causing current to enter the material along the stripes defined by, for example, proton implantation toward a grounded contact on the bottom surface (not shown) of the device 100. Electrons and holes accumulate in the active region below the stripes 120, causing a population inversion. In other words, the electrons of the semiconductor laser medium are pumped to a higher quantum-mechanical energy level to produce a condition of population inversion, in which more of the electrons are excited into a higher quantum energy state than are in a lower energy state. Gain occurs when a photon of energy close to that of the bandgap energy of the active region stimulates the radiative recombination of these electrons and holes and thus increases the net photon density within the cavity defined by each stripe. Due to feedback from the first and second longitudinal end mirrors 140, 150 lasing will occur at the Fabry-Perot modes of the cavity that fall within the gain spectrum of the material. The optical mode of the cavity defined under each stripe 120 spreads out through the layer, interacting with the optical modes from its neighbors. Consequently, these modes couple and all the lasers under the stripes 120 act together as one phased array.

More specifically with respect to the embodiment being described, in semiconductor materials carrier recombination between electrons and holes occurs predominantly by emission of radiation in the near infrared spectrum (800–1500 nanometers). By constructing a pn junction between highly doped p and n regions, a population inversion is created in the vicinity of the junction. In this type of laser, excitation is derived from the forward current flowing through the "diode" and oscillation builds up by resonance within the cavity in the active layer. This cavity is typically less than a millimeter in length, and is formed by cleaving or etching the crystal along faces perpendicular to the junction plane. These surfaces have relatively high Fresnel reflectivity, so as to act as nearly perfect optical mirrors.

Figure 2:
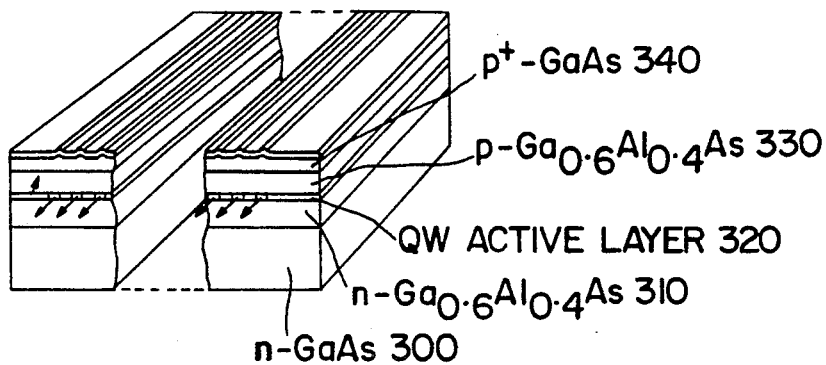
FIG. 2 illustrates a prior art semiconductor structure of a laser array.

Various types of semiconductor laser arrays are in use, but typically they consist of a multi-layered sandwich such as shown in FIG. 2. The laser array includes of a plurality of gain-guided lasers at predetermined distances from one another. The stripes are delineated by a method such as proton implantation through a photo-resist mask. The heterostructure wafer is similar to the modified multiple quantum well (MMQW) structures known in the prior art. Specifically, the device 100 consists of an n-type GaAs substrate 300, upon which is formed an n-type GaAs buffer layer, a n-type GaAlAs layer 310, a n-type GaAlAs cladding layer, a modified multiple quantum well active layer comprising of GaAlAs wells and GaAlAs barrier layers 320, upon which is formed a p-type GaAlAs cladding layer, a p-type GaAlAs layer 330, a p-type GaAs layer 340, and a p-type GaAs cap layer. Several of these layers are omitted from FIG. 2 for simplicity. The n-type and p-type dopants may be Se and Zn, respectively, using the MOCVD (Metal Organic Chemical Vapor Deposition) technique. In the alternative, the n-type and p-type dopants may be Be and Si, respectively, using the MBE (Molecular Beam Epitaxy) technique.

In addition to this typical semiconductor laser array structure (which is also shown in the Scifres et al. article at page 645), the arrangement according to the invention also includes a pair of transverse regions 170, 180, to which a biasing current which are independently addressable through contacts 190, 200, respectively. The common contact 130 and transverse contacts 190, 200 are biased by well known techniques illustrated in conjunction with the exemplary applications described below.

This additional structure creates the capability of controlling transverse gain in the longitudinal array 110. Altering transverse gain varies the gain available for the array to lase in the forward direction, thus making it possible to modulate output. Transverse gain is controlled through application of a bias to the transverse contacts 190, 200. A forward bias on these contacts reduces transverse absorption by "bleaching" the underlying lasing medium in transverse regions 170, 180, thereby allowing transverse gain, supported by transverse end mirrors 210, 220, to occur. On the other hand, a reverse bias removes optically generated carriers, increasing optical absorption in the active layer of the transverse end regions end region, and thus quenching transverse gain.

The term "bleaching" refers to the process whereby all excited states with an energy level close to that of the photons within the laser cavity are filled. The photons lack the energy necessary to affect additional excited carriers and thus the lasing material appears transparent or "bleached" with respect to photons within the cavity.

Thus, in contrast to quenching of the output of a single laser by optical injection from another separate laser such as disclosed in U.S. Pat. No. 3,431,437 to Kosonocky, self-quenching of a longitudinal array 110 in the present invention is effected by controlling the amount of transverse stimulated emission within the array 110. Previous work (cited above) has shown that transverse stimulated emission begins to compete for carriers when the number of stripes in an array becomes sufficiently large (such as when the total width of the array is comparable to its length). Transverse stimulated emission is allowed due to the summation of the transverse gain contributed by each individual laser in the longitudinal array 110. All gain in the array 110—longitudinal or transverse—is derived from the same pool of excited carriers. Thus, as the intensity of the optical output in the transverse direction grows (either by amplified spontaneous emission or stimulated emission), the gain available in the longitudinal direction is increasingly depleted and longitudinal lasing from the array is eventually quenched.

Figure 3A:
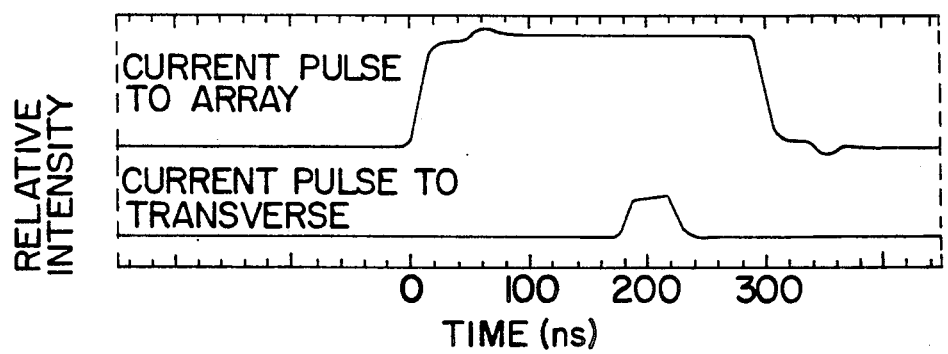
FIGS. 3(a) and 3(b) are graphs showing the interrelationship of changes of current pulses to the array, current pulses to the transverse contacts, and the output of the array.
Figure 3B:
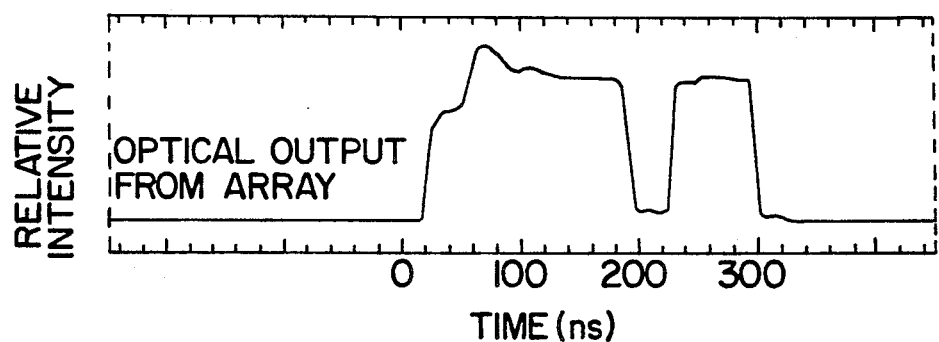

FIG. 3(a) graphically illustrates array emission quenching with transverse forward bias. In this plot, the bottom trace is the optical output of a 30-stripe array detected by a silicon pin photodiode (not shown). The upper trace is the current pulse sent to the array 110 while the middle trace is the current pulse sent to the transverse stripe 160 via transverse contacts 190, 200. When a current pulse is applied to these transverse contacts (a "transverse" current pulse) during a longitudinal array current pulse, a corresponding reduction in the output power of the array occurs, as shown in FIG. 3(b). This experiment is direct evidence of quenching of the longitudinal lasing of the array using the technique of the present invention.

Since transverse stimulated emission begins to compete for carriers when the number of stripes in an array becomes sufficiently large (such as when the total width of the array is comparable to its length), it is assumed that with more stripes 120 in the array 110, less transverse stripe current will be necessary to allow transverse gain (and therefore longitudinal quenching). In addition to the amount of transverse gain, factors that govern the amount of transverse power required to quench the longitudinal lasing include: the amount of gain between stripes 120, the width of the region of depleted gain created by the transverse lasing, the transverse end mirror 140, 150 reflectivities, and the power level at which the array 110 is operated.

As the width of the array 110 exceeds its length, there is enough intrinsic transverse gain to support lasing in the transverse direction without additional optical injection. It thus becomes necessary to inhibit lasing in this direction to allow longitudinal lasing. This may be achieved by configuring the device 100 such that the transverse regions 170, 180 are reverse biased to create absorbing regions, thus absorbing the transverse stimulated emission. In this configuration, only small currents flow to and from these regions. Thus, the speed at which the absorbtivity of these regions could be modulated—and therefore the speed at which the longitudinal lasing could be modulated—is very fast.

Tests of array 110 output power versus transverse input current for a 20-stripe device and a 30-stripe device have been conducted, and a definite reduction in the amount of transverse laser current needed to quench the 30-stripe array output compared to the 20-stripe array was evident.

Another distinct property of this device 100 is the ability of transverse bias to alter the optical coupling conditions between stripes 120 in the array section 110. If the optical fields of the array stripes 120 are coupled in a fixed phase relationship (either by internal or external methods), transverse injection will alter this coupling between individual stripes by changing the gain profile in the regions between the stripes.

Figure 4:
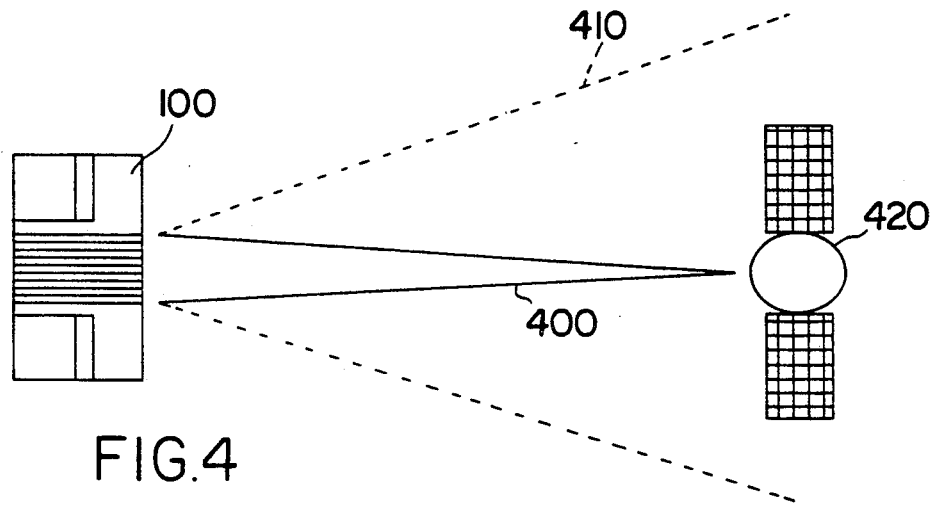
FIG. 4 is a representational diagram illustrating an embodiment of the present invention as it might be used in satellite communications.
Figure 5:
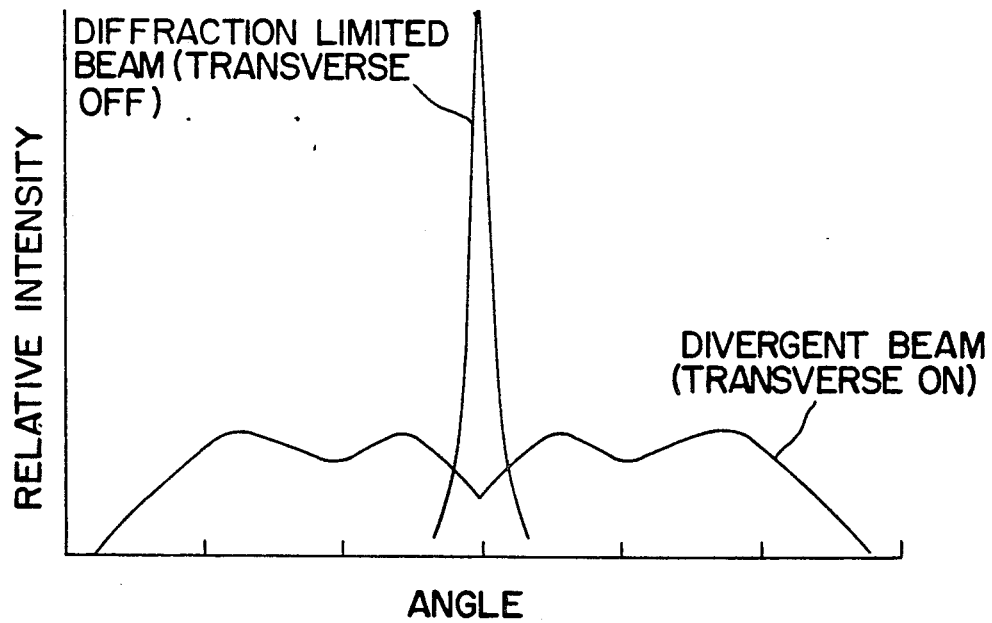
FIG. 5 is a representation of the effect of a transverse pulse on the array output beam pattern.

This capability of altering coupling in turn makes it possible to alter the far field configuration. As illustrated in FIGS. 4 and 5, if the longitudinal array 110 were coupled to emit a nearly diffraction-limited beam 400, transverse biasing would change the coupling so that the emitted beam 410 would not be diffraction limited. This would cause the beam to spread as it propagated, as shown in FIG. 5, and a distant receiver, such as satellite 420 (FIG. 4), would "see" a reduced intensity. This would have the same effect as directly modulating the intensity of the beam.

Evidence of altering of the phase coupling between the individual lasers in the array 110 by transverse bias can be seen in the far field emission pattern of a 30-stripe array that has been examined. FIGS. 6(a) and 6(b) are plots of intensity versus angle, from the 30-stripe array, measured in the far field for transverse bias off (FIG. 6(a)) and for transverse bias on (FIG. 6(b)). While this particular laser was not designed for optimum coupling, the presence of four dominant modes in the far field (with transverse bias off-upper trace) is an indication that some coupling occurred. Three effects are obvious when transverse bias is turned on (FIG. 6(b)). These are that: 1) the intensities of the dominant peaks are reduced; 2) the dominant modes are broken into multiple modes with modes between the dominant modes becoming apparent; and 3) the optical intensity in the "tails" (either side of the mode pattern) is increased. All three of these effects indicate a decoupling of the lasers in the array 110. When transverse bias is turned off, the emission returns to the original four-mode pattern. In this manner, the laser array acts as a monostable device.

It must be noted here that modulation of the array 110 emission by the present method is not governed by the coupled rate equations which describe the injected carrier—cavity photon flux interactions. The injection current into the array 110 will be constant if it is operated in its cw mode. Although the transverse laser optical field produces a depletion of photons in the longitudinal laser mode, the total photon density remains essentially constant. Two extremely important benefits flow from this. First, the switching time of the array from longitudinal to transverse lasing can be as fast as a few cavity lifetimes of a photon. This means the practical limit on how fast the array can be modulated is governed by how fast the transverse lasing can be initiated. Second, "chirping" of the array output wavelength should be minimized. These shifts are normally due to heating transients and changes in the cavity refractive index caused by modulation of the injection current—both of which are ideally not present in the present device 100.

The present invention could be used in all applications where high power diode array lasers need to be modulated. Several such applications will now be described. In the figures for these applications, the plan diagram for the device 100 of FIG. 1(b) will be used with numerals omitted for the sake of clarity. It will be understood by one of ordinary skill in the art, however, that the device 100 is configured substantially as described above.

In one application, the device 100 may be used as a high speed analog or digital optical transistor where the transverse control of lasing would be the analog of a controlling collector-emitter throughput using a much smaller base current. With each stripe coupled to an optical waveguide, this device would have a fanout equal to the number of stripes in the array.

Figure 7A:
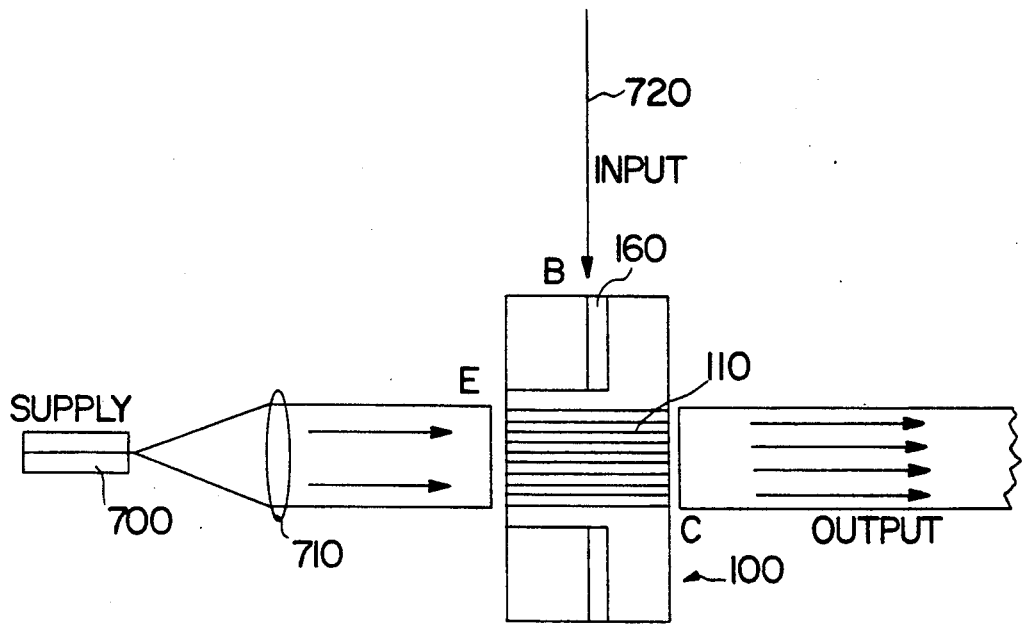
FIG. 7(a) is a representational diagram of an optical transistor in accordance with the present invention.

FIG. 7(a) illustrates an optical transistor wherein a light source 700 is applied to the "emitter". The light (which may be collimated through a collimating lens 710 as shown) from light source 700 acts as a "supply" for amplifying a light source signal incident upon the transverse laser stripe 160, which acts as the base. The transverse incident beam may come from an optical waveguide 720 or another light source. It follows that the output of the longitudinal laser array 110 is the analog of the collector output.

Figure 7B:
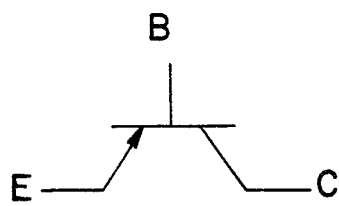
FIG. 7(b) is a schematic diagram of the optical transistor shown in FIG. 7(a).

FIG. 7(b) is a schematic diagram for the optical transistor shown in FIG. 7(a).

Figure 7C:
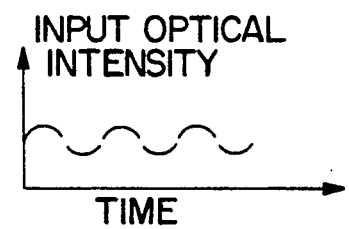
FIG. 7(c) and FIG. 7(d) are graphs of the input and output signals, respectively, of the optical transistor shown 7(a).
Figure 7D:
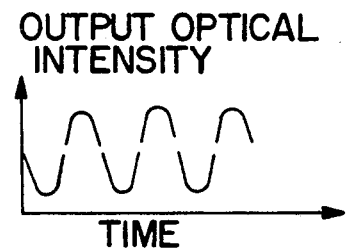

FIG. 7(c) graphically illustrates an optical signal intensity input to the transverse stripe or "base" (in this example, a simple sine wave) which is selectively amplified and output by the longitudinal laser array 110, as shown in FIG. 7(d). The intensity of the transverse or base input governs the degree of amplification. The common contact 130 and transverse contacts 190, 200 need not be connected to current sources in this embodiment since injected light stimulates emission. Also note that the input and output signals of the optical transistor are 90° out of phase as evident from FIGS. 7(c) and 7(d).

Figure 8A:
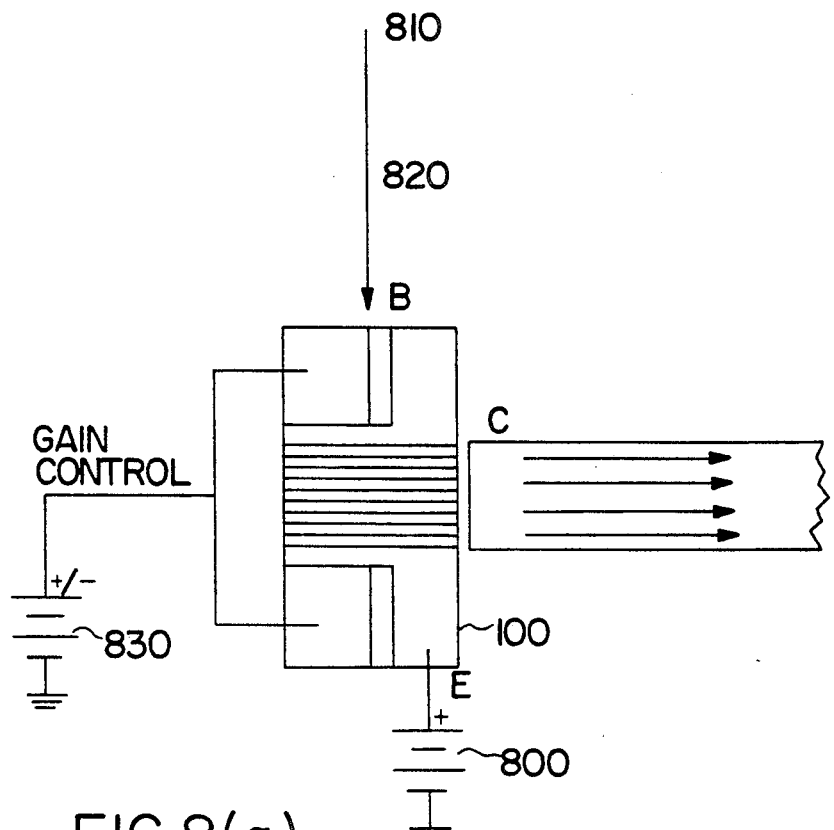
FIG. 8(a) is a representational diagram of a first embodiment of an hybrid electro-optical transistor in accordance with the present invention.

Similarly, FIG. 8(a) illustrates one embodiment of a hybrid electro-optical transistor wherein the "emitter current" is derived from a current source or array laser bias 800. The current source 800 causes a population inversion in the active region and thereby spontaneous stimulated emission. The emission is amplified upon passing through the cavities of the longitudinal laser array 120 in accordance with the strength of light from a light source 810 incident upon the transverse stripe 160, which acts as the base terminal. The transverse incident beam may come from an optical waveguide 820 as shown or from or another light source. It follows that the output of the longitudinal laser array 110 acts as the collector current.

Figure 8B:
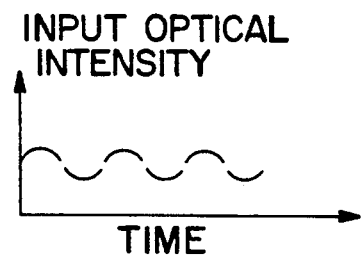
FIGS. 8(b) and 8(c) are graphs of the input and output signals, respectively, of the hybrid electro-optical transistor shown in FIG. 8(a).
Figure 8C:
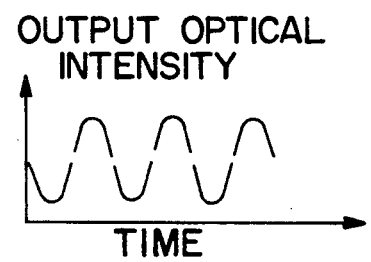

FIG. 8(b) graphically illustrates an optical signal intensity input to the base (in this example, a simple sine wave) which is selectively amplified, phase shifted, and output by the longitudinal laser array, as shown in FIG. 8(c). The intensity of the transverse or base input from transverse bias 830 governs the degree of amplification.

The hybrid electro-optical transistor shown in FIG. 8(a) operates in much the same way as the optical transistor shown in FIG. 7(a), with the addition of the transverse bias source 820 connected to the transverse contacts 190, 200. As with the optical transistor shown in FIG. 7(a), light injected along the transverse laser acts as a base contact input which is amplified to a corresponding collector or longitudinal array 110 output. The transverse bias bleaches the active region if biased in a forward direction. This causes the gain of the transistor to be relatively large due to the fact that relatively little transverse injected light is required to start the laser material lasing in the transverse direction, and therefore not in the forward or longitudinal direction. In other words, relatively little input causes a relatively dramatic change in the output, i.e., the transistor displays a large amplification ratio. However, if the transverse bias is a reverse bias, the end regions 170, 180 of the transverse stripe 160 act as absorbing regions. This means that even if the longitudinal array 110 is wide enough to support lasing in a transverse direction, the reverse bias will normally prevent or inhibit transverse lasing. Thus, an input optical intensity (injected in a transverse direction) is necessary to produce transverse lasing, and therefore reduce longitudinal lasing. Whether a forward or reverse bias is applied depends on the ability of the lasing material to support lasing in a transverse direction. It should be noted that the input is 90° out of phase with respect to the output in this embodiment as well, as evident from FIGS. 8(b) and 8(c).

Figure 9A:
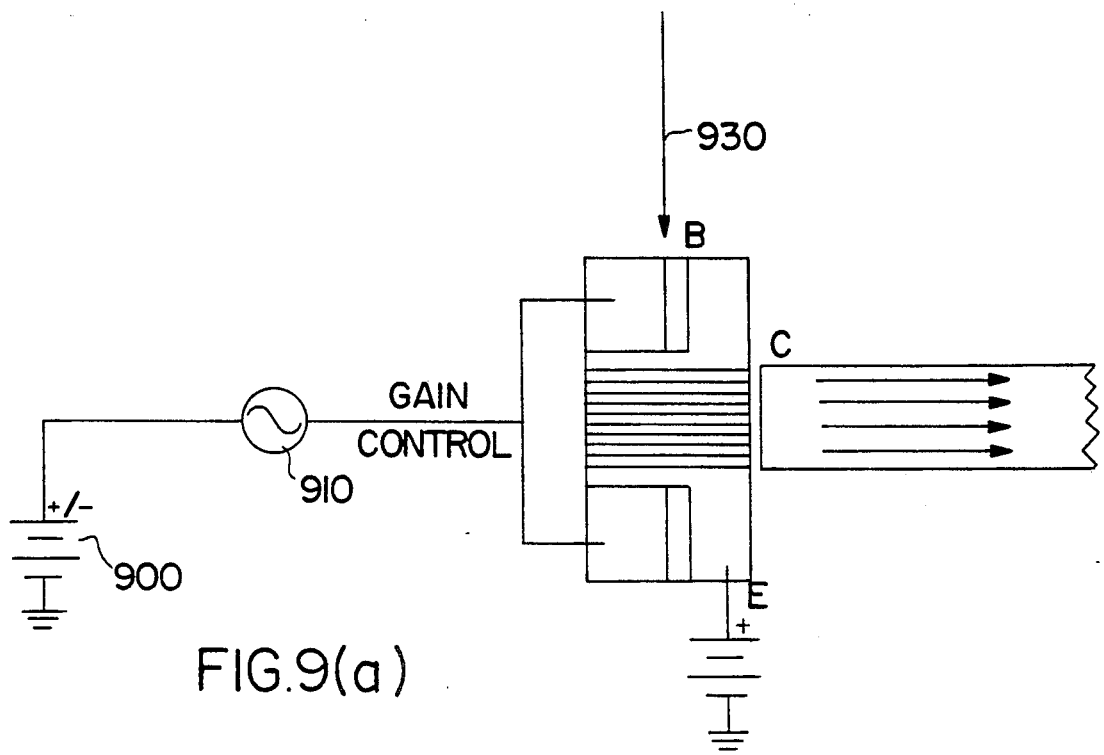
FIG. 9(a) is a representational diagram of a second embodiment of a hybrid electro-optical transistor in accordance with the present invention.
Figure 9B:
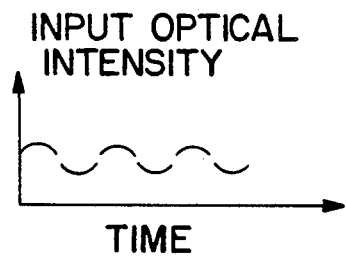
FIGS. 9(b) and 9(c) are graphs of the input and output signals, respectively, of the hybrid electro-optical transistor shown in FIG. 9(a).
Figure 9C:
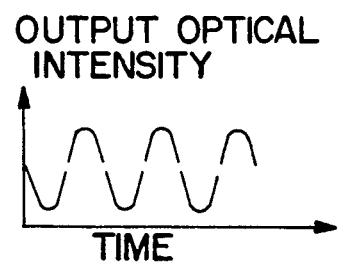

FIG. 9(a) illustrates a second embodiment of a hybrid electro-optical transistor. This embodiment is similar to the embodiment shown in FIG. 8(a) except that the D.C. transverse current source 900 is modulated by a signal modulator 910. The signal modulator 910 applies a varying bias to the transverse contacts 190, 200 so that the transverse bias varies between a forward bias and a reverse bias, and points therebetween. The effect of the varying bias is to vary between bleaching the active region of the transverse stripe 160 and causing absorbing regions to appear in the transverse stripe 160. Thus, if the input optical signal were steady state, the optical output of the longitudinal array would have a frequency identical, and either in or out of phase to (depending on the bias direction of the bias source 900) the signal of the signal modulator 910. The case in which the input optical signal and the output optical signal are 90° out of phase is shown in FIGS. 9(b) and 9(c). In other words, the signal modulator 910 induces the equivalent of a carrier frequency on the output optical intensity. The input optical intensity 930, by analogy, would be a modulator signal.

Figure 10A:
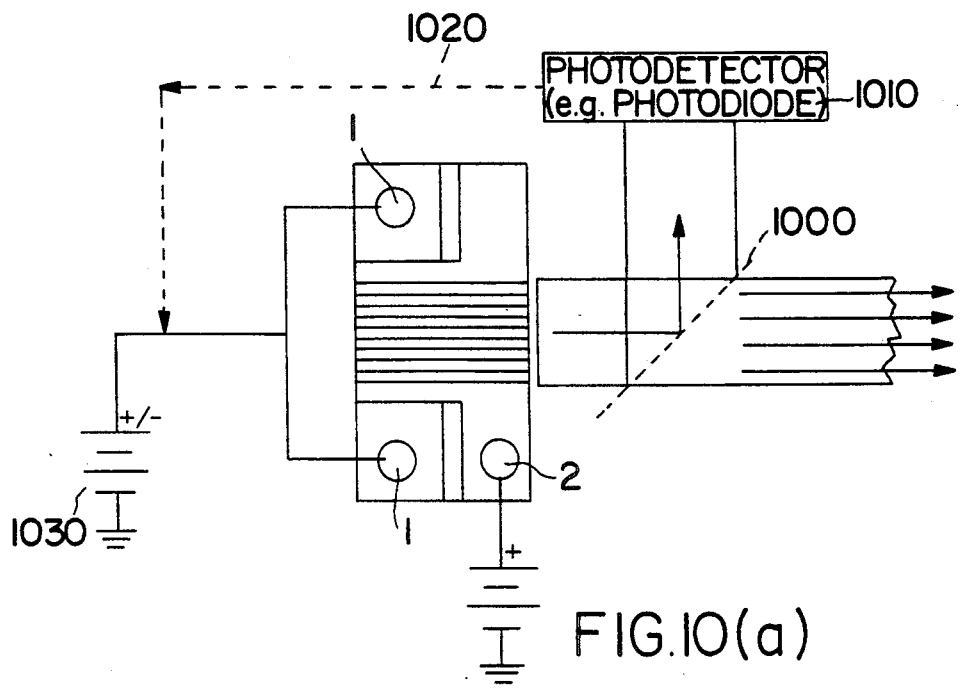
FIG. 10(a) is a representational diagram of a hybrid electro-optical oscillator in accordance with the present invention.
Figure 10B:
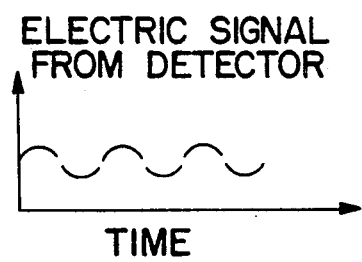
FIGS. 10(b) and 10(c) are graphs of the input and output signals, respectively, of the hybrid electro-optical oscillator shown in FIG. 10(a).
Figure 10C:
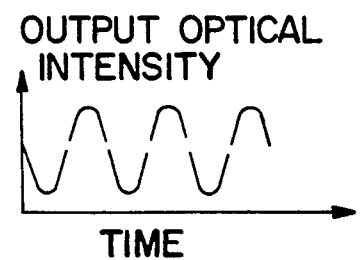

FIG. 10(a) illustrates a hybrid electro-optical oscillator. In this embodiment, the longitudinal laser output is projected through a beam splitter 1000 so that part of the optical output is projected onto a photodetector 1010. The signal 1020, developed by the photodetector 1010, is applied to alter the bias created by the transverse D.C. laser bias source 1030. The signal 1020 developed by the photodetector 1010 thus affects the level of the bias applied to transverse contacts 190, 200. The varying bias on transverse contacts 190, 200 causes a variation in the transverse gain and thereby affects the output of the longitudinal laser array 110. Thus, the signal 1020 is a feedback signal representative of the longitudinal output and applied to the transverse contacts. The overall arrangement thus acts as an oscillator with a period equal to the period required for the signal 1020 to be fed back. Note that the signal 1020 from the photodetector 180 is 90° out of phase with the longitudinal array 110 output, as evident from FIGS. 10(b) and 10(c).

It is also possible to arrange an optical waveguide such that light from one stripe of the phased array is injected back into the array in a transverse direction such that an oscillator is formed with a period equal to the transit time of the optical pulse through the guide.

The present invention may be configured as either a mono-stable or a bi-stable device. In this case, a bias pulse applied to the transverse contact is all that is needed to switch the device between forward lasing and transverse lasing.

A monostable device has already been described above. As regards a bi-stable device, it has been observed that upon increasing the forward bias of the longitudinal array 110, there occurs a transition point when the array spontaneously and dramatically reduces emission in a forward direction and begins emission in a transverse direction. This array bias transition point changes with transverse bias. It occurs at a lower array bias, say "B", when a positive transverse is applied, and at a higher array bias, say "C", at zero or negative transverse bias.

Figure 11A:
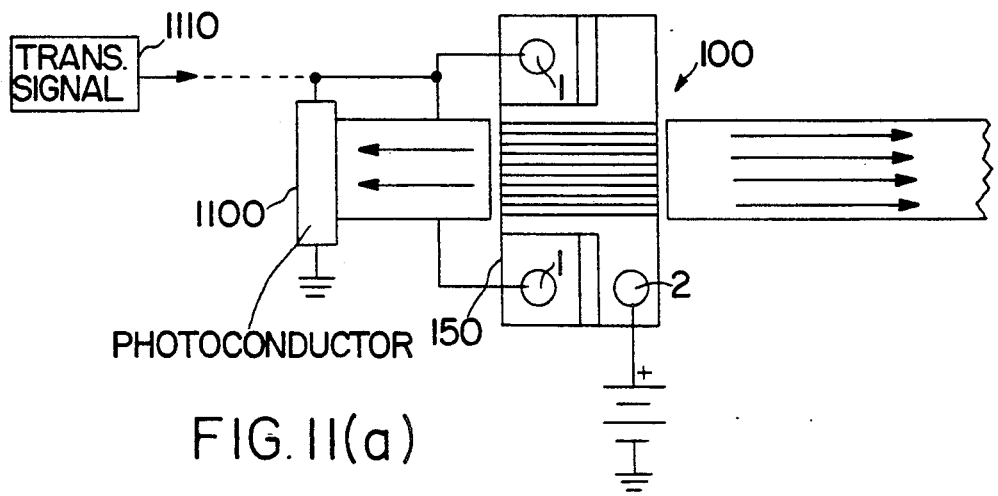
FIG. 11(a) is a representational diagram of a bi-stable configuration in accordance with the present invention.

This effect is exploited in the bi-stable configuration shown in FIG. 11(a). In the embodiment of FIG. 11(a), the part of the main array output reaches a photoconductor 1100 through a partially transmissive longitudinal end mirror 150. This effectively grounds the transverse contacts so that there is no transverse bias and the bias transition point increases to a point, say "C", as shown by the broken curve in FIG. 11(c). Since the array current is chosen to be less than "C", the forward output remains high.

Figure 11B:
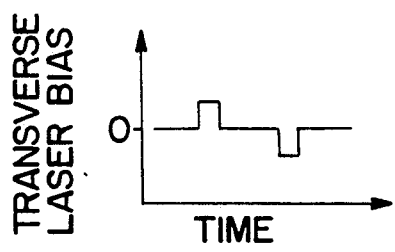
FIGS. 11(b) and 11(c) are graphs of the input and output signals, respectively, of the bi-stable configuration shown in FIG. 11(a).

At a high state of output, a positive transverse bias pulse (shown in FIG. 11(b)) is introduced by a transverse pulse generator 1110. This transverse pulse is sufficient to shift the transition point of the longitudinal array 110 to a value "B" below the array current and so to cause the longitudinal array output to drop to a low level or state. The low level causes the photoconductor 1100 to become resistive so that a bias voltage is maintained across the transverse contacts 190, 200, thus maintaining transverse lasing.

Figure 11C:
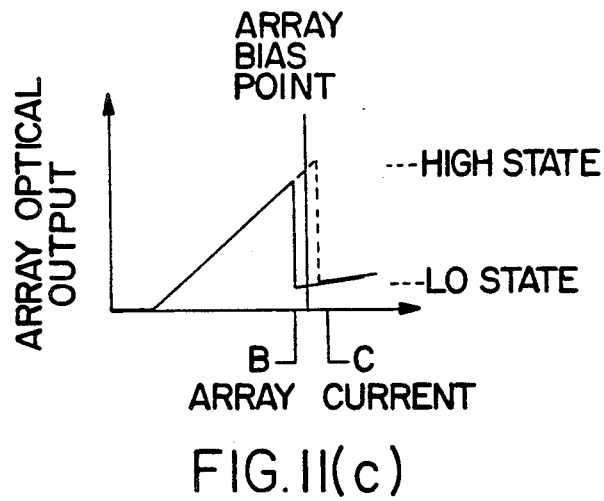

A small negative pulse (shown in FIG. 11(b)) from the transverse pulse generator 1110 again raises the transition point, thereby causing the array 110 to resume a high level optical output, as illustrated in FIG. 11(c). The light from the longitudinal lasing causes photoconductor 1100 to become conductive, thus, reducing the voltage drop across photoconductor 1100 and hence the voltage applied to the transverse contacts 190, 200. This latches in the high state until a positive pulse is again applied. Thus, the bi-stable device requires relatively small currents to switch states.

It is important to note that the array bias level and transition levels are chosen so that the array bias level is between the transition levels to create a hysteresis effect, and, hence, two stable states.

Figure 12A:
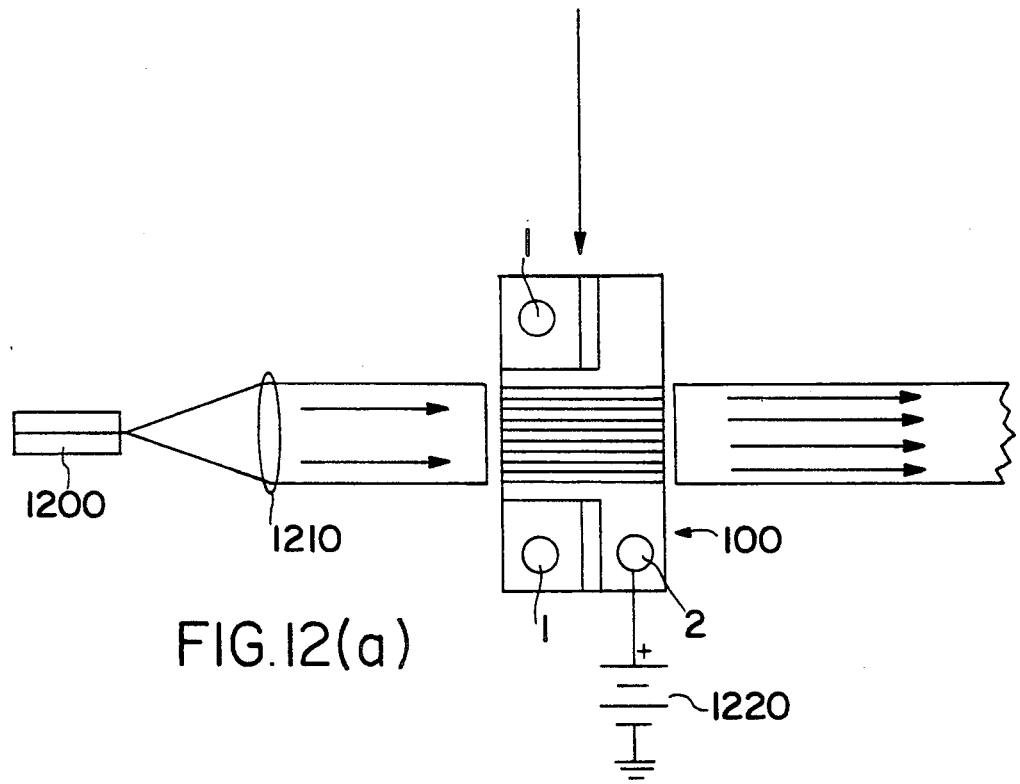
FIG. 12(a) is a representational diagram of a MOPA configuration in accordance with the present invention.
Figure 12B:
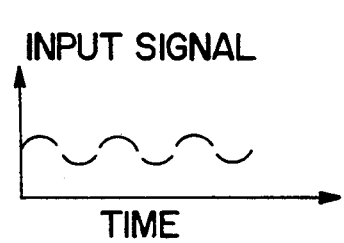
FIGS. 12(b) and 12(c) are graphs of the input and output signals, respectively, of the MOPA configuration shown in FIG. 12(a).
Figure 12C:
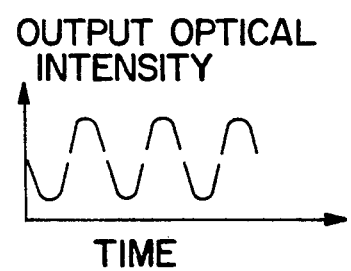

FIG. 12(a) illustrates a Master Oscillator Power Amplifier (MOPA). In this embodiment, a master oscillator (CW) 1200 projects a collimated beam (for example via a collimating lens 1210) onto the longitudinal laser array 110. The common contact 130 is biased by an array laser bias source 1220 to create a population inversion among the carriers in the active region of the laser material. Thus far, the configuration is a simple optical amplifier. However, either an optical input applied to the transverse stripe 160 or an electrical signal applied to the transverse contacts 190, 200 will cause the output of the longitudinal laser array 110 to vary due to increased transverse lasing or gain. The transverse input signal is 90° out of phase with respect to the amplified longitudinal optical output as shown in FIGS. 12(b) and 12(c).

The advantage of this MOPA configuration is the fast modulation time due to the use of transverse lasing to deplete the carriers normally available for longitudinal lasing.

Standard device processing techniques are used to produce the device 100. The device 100 may be fabricated using all the same materials and processing techniques used in making typical high power diode array lasers.

Many possible applications of the present invention have been set forth above; conceivably, many more are possible. For example, it may be used as a stand-alone device or as a power amplifier/modulator for another separate laser. Also, several concrete configurations have been described above for the purposes of simplifying explanation. Many variations of the details of these configurations are, however, possible without departing from the principles of the invention. For example, there may be variations in the layer structure of the semiconductor materials, the number, widths, and spacings of the array stripes, the number, widths, spacings, and angle of the transverse stripes, the method and amount of array stripe delineation (proton bombardment, etched mesa, buried heterostructure, etc.), contact pad metals and dimensions, array and transverse cavity dimensions, and reflectivity of array and transverse cavity mirror facets (including cleaved, polished, or cut facets with various coatings for high or low reflectivity). The choice of these parameters and so the preferred configuration for a given application will in general be determined by the particular requirements of that application. The preferred configurations for optimum operation of the device 100 in its possible modes (modulation of output amplitude by induced transverse lasing or modulation of phase coupling between stripes) are readily determined.

What is claimed is:

1. Apparatus comprising:
   a laser including a lasing medium, said laser being oriented in a first direction; and
   means for controlling lasing in said lasing medium in a direction transverse to said first direction, wherein at least part of said lasing medium is controllable to lase in both said first direction and said transverse direction, and wherein said controlling means comprises at least one region axially adjacent said laser, integrally formed of said lasing medium, and controllable to inhibit lasing in said transverse direction.

2. An apparatus as claimed in claim 1, wherein said laser further includes a first electrical contact for applying a first current signal to said laser, and wherein said controlling means further comprises a second electrical contact, insulated from said first electrical contact, for applying a second current signal to said at least one region axially adjacent said laser and integrally formed of said lasing medium, lasing in said at least one region in said transverse direction being inhibited in response to said second current signal.

3. An apparatus as claimed in claim 2, further comprising means, connected to said second electrical contact, for generating said second current signal, wherein said second current signal causes said at least one region to absorb light of the frequency emitted by said laser.

4. An apparatus as claimed in claim 3, wherein said controlling means comprises a first region axially adjacent and to one lateral side of said laser and integrally formed of said lasing medium, and a second region axially adjacent and to the other lateral side of said laser, aligned with and opposed to said first region, and integrally formed of said lasing medium, and wherein said first and second regions absorb light of the frequency emitted by said laser in response to said second current signal.

5. Apparatus comprising:
   a laser including a lasing medium and a first electrical contact for applying a first current signal to said laser, said laser being oriented in a first direction;
   means for controlling lasing in said lasing medium in a direction transverse to said first direction, wherein at least part of said lasing medium is controllable to lase in both said first direction and said transverse direction, said controlling means comprising a first region axially adjacent and to one lateral side of said laser and integrally formed of said lasing medium, a second region axially adjacent and to the other lateral side of said laser, aligned with and opposed to said first region, and integrally formed of said lasing medium, a second electrical contact, insulated from said first electrical contact, for applying a reverse bias signal to said first region, and a third electrical contact, insulated from said first electrical contact, for applying said reverse bias signal to said second region; and means, connected to said second and third electrical contacts, for generating said reverse bias signal to cause said first and second regions to absorb light of the frequency emitted by said laser.

6. An apparatus as claimed in claim 5, further comprising a first at least partially reflective element at an end of said first region distal from said laser and a second at least partially reflective element at an end of said second region distal from said laser.

7. Apparatus comprising a lasing medium, a first volume of said lasing medium forming at least part of a laser oriented in a first direction and a second volume of said lasing medium intersecting said first volume and forming at least part of means for controlling lasing in said lasing medium in a direction transverse to said first direction, wherein said intersecting region of said first and second volumes is controllable to lase in both said first direction and said transverse direction and at least part of said second volume is controllable to inhibit lasing in said transverse direction.

8. An apparatus as claimed in claim 7, further comprising means for applying a first current signal to said first volume, and wherein said controlling means comprises means for applying a second current signal to said at least part of said second volume, and wherein said at least part of said second volume is not intersecting said first volume.

9. An apparatus as claimed in claim 8, wherein said controlling means comprises means for generating said second current signal, and wherein said second current signal causes said at least part of said second volume not intersecting said first volume to absorb light of the frequency emitted by said first volume.

10. Apparatus comprising:
a semiconductor laser array including a plurality of stripes in a longitudinal direction and at least one stripe in a transverse direction relative to said longitudinal stripes;
means for creating a population inversion in said semiconductor laser medium;
means for stimulating emission in said longitudinal direction;
means for controlling stimulated emission in a direction transverse to said longitudinal direction to deplete gain available in said longitudinal direction.

11. The apparatus as claimed in claim 10, wherein said means for controlling transverse emission comprises means for applying a transverse bias to said at least one transverse stripe.

12. Apparatus as claimed in claim 10 wherein said plurality of stripes and said means for stimulating emission in said longitudinal direction are configured to function as a collector-emitter junction of an optical transistor, and said at least one transverse stripe and said means for controlling stimulated emission in said transverse direction are configured to function as a base of said optical transistor.

13. The apparatus as claimed in claim 10, wherein said means for controlling transverse emission comprises means for applying a transverse bias to said at least one transverse stripe.

14. An apparatus as claimed in claim 10 wherein said semiconductor laser array is configured so that forward emission by said means for stimulating emission in said longitudinal direction is a stable state to which the array returns after a stimulated emission in said transverse direction.

15. The apparatus as claimed in claim 14, wherein said means for controlling transverse emission comprises means for applying a transverse bias to said at least one transverse stripe.

16. An apparatus as claimed in claim 10, wherein said array is configured such that forward emission by said means for stimulating emission in said longitudinal direction is a first stable state and transverse emission by said means for controlling stimulated emission in said transverse direction is a second stable state.

17. The apparatus as claimed in claim 16, wherein said means for controlling transverse emission comprises means for applying a transverse bias to said at least one transverse stripe.

18. Apparatus as claimed in claim 10, further comprising means for generating an electrical signal indicative of an intensity of said longitudinal emission of at least one stripe of said plurality of stripes, said electrical signal being applied to said at least one transverse stripe for controlling stimulated emission in a said transverse direction, thereby forming an oscillator with a period substantially equal to the transit time of said electrical signal.

19. Apparatus as claimed in claim 10, further comprising:
means for biasing said plurality of transverse stripes with a current which is lower by a predetermined amount than a level at which said stripes spontaneously lase transversely;
means for generating an electrical signal indicative of an intensity of said longitudinal emission of said plurality of stripes, said electrical signal being applied to said at least one transverse stripe; and
means for generating a current pulse having a first polarity and applying said current pulse to said transverse stripe, said current pulse causing said plurality of stripes to lase transversely, thus causing the plurality of stripes to transition to a state of reduced longitudinal output and changing a level of said electrical signal to latch said state of reduced longitudinal output until a current pulse of a second polarity different from said first polarity is applied to said transverse stripe,
thereby forming a bi-stable device.

20. A semiconductor laser array structure comprising:
a first layer of n-type semiconductor material;
a second layer of p-type semiconductor material;
an active layer defined between said first layer and said second layer wherein a population inversion is created;
one of said first layer and said second layer including a plurality of stripes in a longitudinal direction delineated by proton implantation and at least one stripe transverse to said longitudinal stripes also delineated by a proton implantation;

a common contact adjacent said plurality of longitudinal stripes; and a transverse contact placed adjacent said transverse stripe, said semiconductor laser array thus being capable of stimulated emission either in a longitudinal direction by applying bias to said longitudinal contacts or a transverse direction by applying bias to said transverse contact.

21. A semiconductor laser array structure according to claim 20, wherein the width of the laser array exceeds its length and said at least one transverse contact is reverse biased to create transverse absorbing regions.

22. A method of modulating a semiconductor laser, said method comprising the steps of:

providing a semiconductor laser medium including a plurality of stripes in a longitudinal direction and at least one stripe in a transverse direction relative to said longitudinal direction;

creating a population inversion in said laser medium;

stimulating emission in such longitudinal direction; and controlling stimulated emission in said transverse direction to deplete gain available in said longitudinal direction.

23. The method of claim 22, wherein the step of controlling transverse emission is achieved using transverse bias.

24. A method of modulating optical coupling conditions between stripes of a phased semiconductor laser array, said method comprising the steps of:

providing a semiconductor laser medium including a plurality of stripes in a longitudinal direction and at least one stripe in a transverse direction relative to said longitudinal stripes;

creating a population inversion in said laser medium;

stimulating emission of a beam in said longitudinal direction; and controlling stimulated emission in a direction transverse to said longitudinal stripes to alter a gain profile between said plurality of stripes, and thus alter phase coupling between said plurality of stripes.

25. The method of claim 24, wherein the step of controlling transverse emission is achieved using transverse bias.

* * * * *